United States Patent
Behzad et al.

(10) Patent No.: US 7,030,687 B2
(45) Date of Patent: Apr. 18, 2006

(54) BIASING SCHEME FOR LOW SUPPLY HEADROOM APPLICATIONS

(75) Inventors: Arya Reza Behzad, Danville, CA (US); Frank Wayne Singor, Sunnyvale, CA (US)

(73) Assignee: Broadcom Corporation, Irvine, CA (US)

(*) Notice: Subject to any disclaimer, the term of this patent is extended or adjusted under 35 U.S.C. 154(b) by 48 days.

(21) Appl. No.: 10/952,928

(22) Filed: Sep. 30, 2004

(65) Prior Publication Data

US 2005/0046471 A1 Mar. 3, 2005

Related U.S. Application Data

(63) Continuation of application No. 10/665,620, filed on Sep. 22, 2003, now Pat. No. 6,812,779, which is a continuation of application No. 10/360,810, filed on Feb. 10, 2003, now Pat. No. 6,667,654, which is a continuation of application No. 10/127,752, filed on Apr. 23, 2002, now Pat. No. 6,531,915, which is a continuation of application No. 09/712,413, filed on Nov. 13, 2000, now Pat. No. 6,396,335.

(60) Provisional application No. 60/164,988, filed on Nov. 11, 1999.

(51) Int. Cl.
   *G05F 1/10* (2006.01)

(52) U.S. Cl. ...................... 327/543; 327/563
(58) Field of Classification Search ................ 323/315, 323/316; 327/530, 534, 535, 537, 538, 543, 327/563; 330/257, 261
See application file for complete search history.

(56) References Cited

U.S. PATENT DOCUMENTS

| | | | |
|---|---|---|---|
| 4,618,815 A | 10/1986 | Swanson | |
| 5,107,199 A | 4/1992 | Vo et al. | |
| 5,157,285 A | 10/1992 | Allen | |
| 5,248,932 A | 9/1993 | Prentice | |
| 5,252,910 A | 10/1993 | Agaesse | |
| 5,359,296 A | 10/1994 | Brooks et al. | |
| 5,781,061 A | 7/1998 | Miyashita et al. | |
| 5,835,994 A * | 11/1998 | Adams | 323/315 |
| 5,982,201 A | 11/1999 | Brokaw et al. | |
| 6,075,405 A | 6/2000 | Nishino et al. | |

FOREIGN PATENT DOCUMENTS

EP  0 791 876 A2  8/1997

OTHER PUBLICATIONS

International Search Report for PCT/US00/42155, dated Aug. 9, 2001, issued by the European Patent Office.

* cited by examiner

*Primary Examiner*—Jeffrey Zweizig
(74) *Attorney, Agent, or Firm*—Sterne, Kessler, Goldstein & Fox P.L.L.C.

(57) ABSTRACT

Methods and apparatus for improving the current matching within current mirror circuits in applications such as low voltage integrated circuits. Embodiments of the present invention attempt to maintain the proper current ratio between reference and output supplies by adjusting the reference output of the current mirror. An existing reference voltage on the output side of the mirror can be used or a reference voltage can be created to be used for the voltage regulation of the reference side of the current mirror.

17 Claims, 9 Drawing Sheets

US 7,030,687 B2

BIASING SCHEME FOR LOW SUPPLY HEADROOM APPLICATIONS

CROSS-REFERENCE TO RELATED APPLICATION(S)

This application is a continuation of U.S. patent application Ser. No. 10/665,620, now U.S. Pat. No. 6,812,779 filed Sep. 22, 2003, which is a continuation of U.S. patent application Ser. No. 10/360,810, now U.S. Pat. No. 6,667, 654 filed Feb. 10, 2003, which is a continuation of U.S. patent application Ser. No. 10/127,752 (now U.S. Pat. No. 6,531,915), filed Apr. 23, 2002, which is a continuation of U.S. patent application Ser. No. 09/712,413 (now U.S. Pat. No. 6,396,335 B1), filed Nov. 13, 2000, which claims the benefit of U.S. Provisional Application No. 60/164,988 filed Nov. 11, 1999, all of which are incorporated herein by reference in their entireties.

FIELD OF THE INVENTION

The invention relates to analog circuit design, and in particular embodiments to low voltage integrated circuits in which current mirroring is employed.

BACKGROUND OF THE INVENTION

In analog integrated circuitry there is often a requirement to provide a precise ratio of currents based on a reference current. Providing such currents is commonly accomplished using current mirrors.

Modern integrated circuits typically operate with reduced supply voltages, in order to conserve energy and to accommodate low voltage digital circuits. As the components within integrated circuits continue to shrink, circuit breakdown voltages typically decrease and supply voltages decrease accordingly. Because of the lower supply voltages within modern integrated circuits, power supplies used for current mirrors and other analog circuitry may be constrained to operate with reduced supply voltages. Accordingly, the voltage available for the functioning of current mirrors is decreased and performance may suffer. Because of decreasing supply voltages, circuit parameters may have an increasing effect on the current provided by current mirrors. Accordingly, there is a need within the art for improved biasing techniques for use with current mirrors.

SUMMARY OF THE INVENTION

Embodiments of the present invention attempt to maintain the proper current ratio between a reference current and the output current of the current mirrors. Embodiments of the current invention attempt to maintain the proper current ratio between the reference current and output current of current mirrors through methods applied to the reference side of the current mirror. This method of compensation using the reference side of the current mirror may be more effective than attempting to increase the current in the output sides of the current mirror, especially in those cases in which the supply voltage of the output current side is low. If most of the supply voltage is dropped across the load, of the output side of the current mirror, no voltage headroom may be left to perform current regulation necessary to maintain the proper ratio between reference and output currents.

Embodiments of the present invention may include such methods as matching the voltage across the output device in the reference side of the current mirror to the voltage drop in the output device of the output side of the current mirror. Embodiments of the present invention may also include various measures to insure that the internal impedance of the reference side is proportional to the impedance of the output side of the current mirror in such a ratio as to maintain the proper current ration between the reference current and the output current.

BRIEF DESCRIPTION OF THE DRAWINGS

Referring now to the accompanying drawings in which consistent numbers refer to similar parts throughout.

DETAILED DESCRIPTION OF THE INVENTION

Figure 1A:
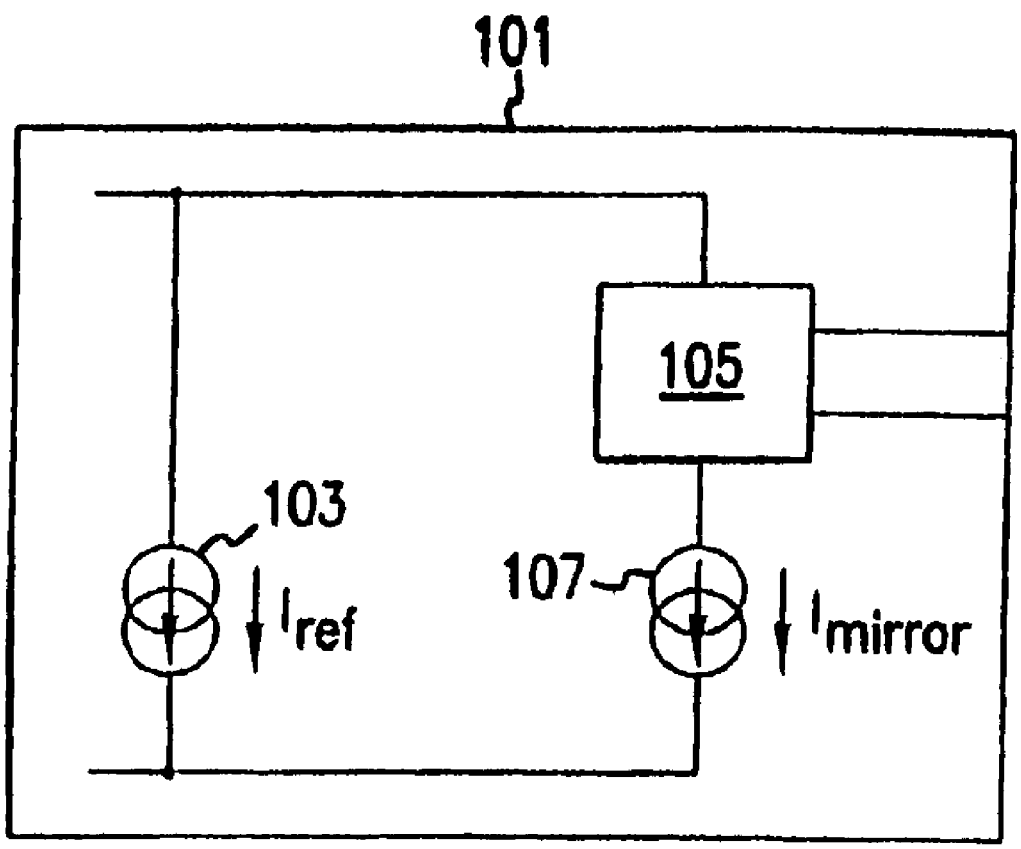
FIG. 1A is a graphical representation of an exemplary environment in which an embodiment of the invention may operate.

FIG. 1A is a graphical representation of an environment in which an embodiment of the invention may operate. In FIG. 1A integrated circuit 101 includes current source 103 which draws a reference current $I_{ref}$. The current $I_{ref}$ is duplicated by a mirror current source 107, supplying a current of $I_{mirror}$. The mirror current, $I_{mirror}$, is supplied to a load 105. Such a configuration as illustrated in FIG. 1A is commonly used within the analog portions of integrated circuits. The current $I_{mirror}$ may be equal to $I_{ref}$, the reference current, or it may be a multiple of $I_{ref}$.

Figure 1B:
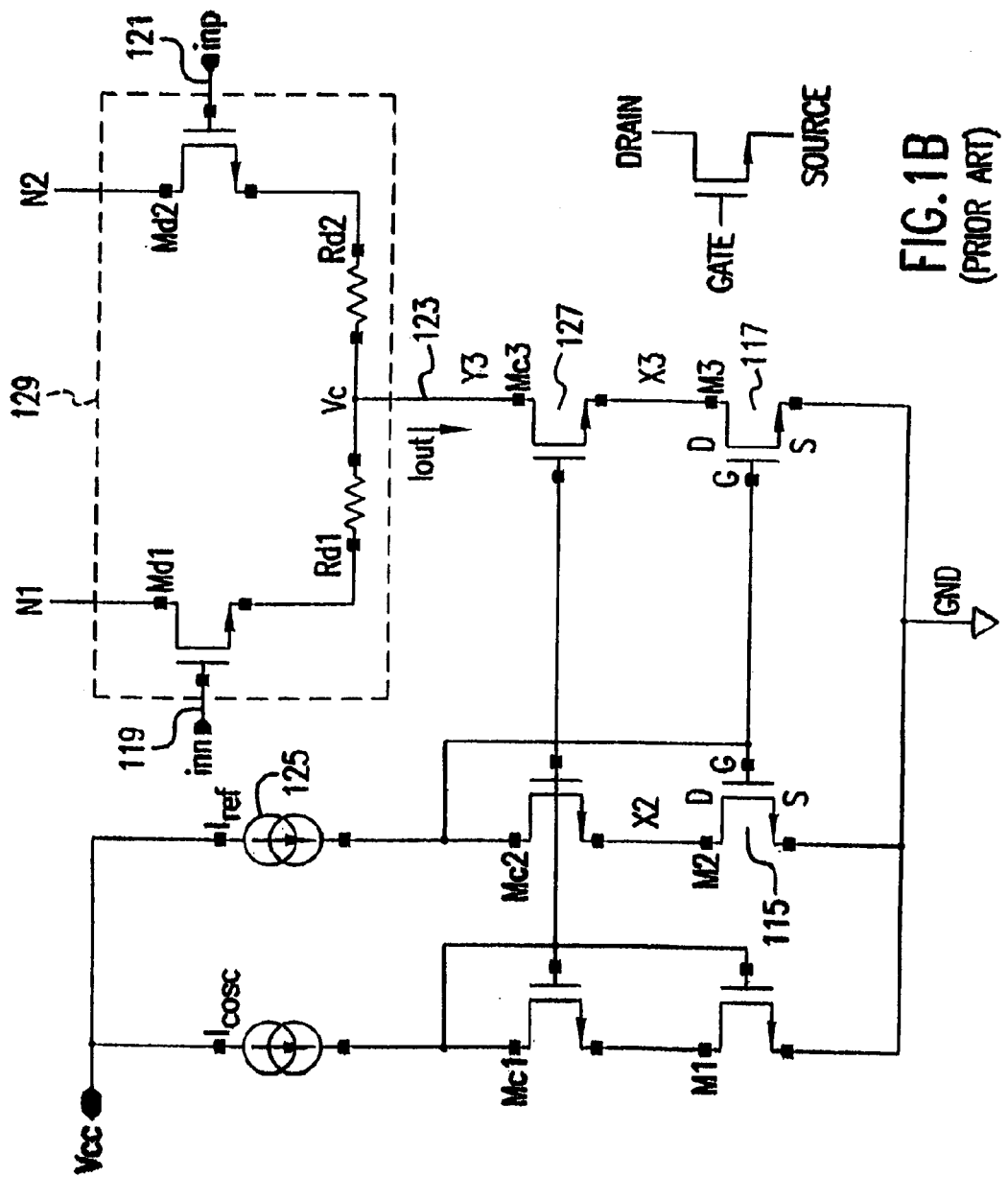
FIG. 1B is a circuit diagram of a current mirroring system according to the prior art.

FIG. 1B is a circuit diagram of a prior art current mirroring system. The circuit in FIG. 1B attempts to replicate reference current $I_{ref}$ 125 in the output branch of the circuitry 123. That is, it is desirable to make $I_{out}$ the same value as $I_{ref}$. In order to make $I_{out}$ equal to $I_{ref}$, the voltage across the drain source junction (Vds) of device 115 should equal the Vds of device 117. Because devices 115 and 117 are integrated devices, their characteristics are very similar. If the drain voltages of devices 115 and 117 are equal, the currents through the devices will be essentially equal because the gates of the devices are at equal potential, that is, they are tied together. A problem occurs when the common mode voltage at point 123 of the differential input circuit 129 drops. When the voltage at point 123 drops, device 127 (the upper device of the cascode pair 127 and 117) may not remain in saturation. If device 127 comes out of saturation, and goes into triode mode, drain voltage on device 117 will be lower than the drain voltage on device 115. Because the drain voltage on device 117 is lower, the current through device 117 will be lower than the current through device 115 and the output current $I_{out}$ will no longer match the current (or a multiple of the current) produced by the reference source $I_{ref}$ 125. Differential input circuit 129 is shown for the purposes of illustration. In practice, any circuit coupled to the mirror current source $I_{out}$ will experience a similar problem once the voltage at the output of that circuit, i.e., the voltage at point 123 drops sufficiently. The problem is exacerbated in the case where devices 115 and 117 are operated in the degenerative mode, in which resistors are added between the source and ground of devices 115 and 117.

Figure 2:
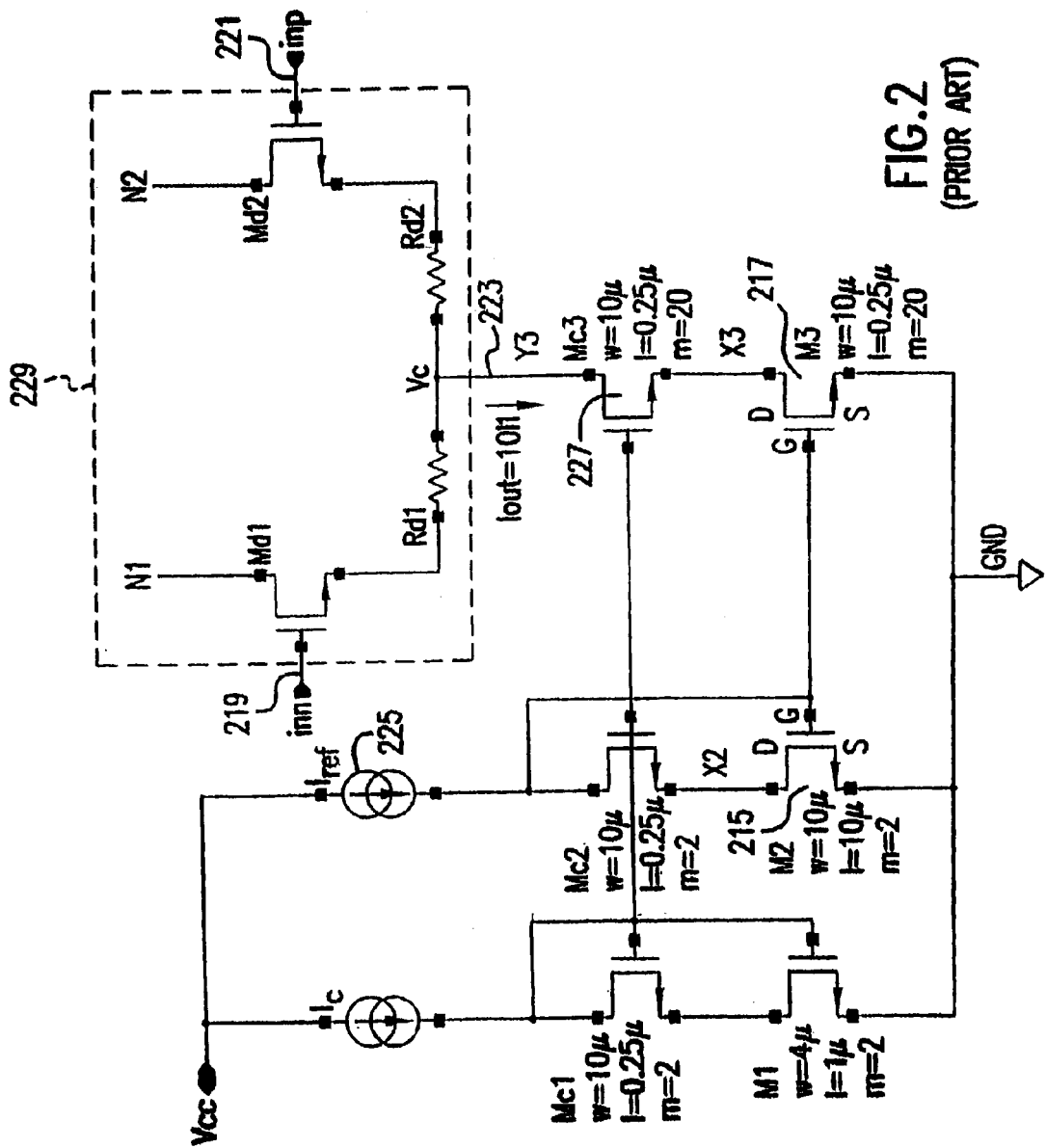
FIG. 2 is a schematic of exemplary prior art multiplying current mirror.

FIG. 2 is a schematic of an example of a prior art multiplying current mirror. FIG. 2 is similar to FIG. 1 except that the current mirroring devices illustrated actually represent multiple devices. That is, for example, the output cascode pair 227 and 217 each represent 20 devices in parallel. Device 215 represents two devices in parallel. Because the ratio of the number of devices in the reference current source to the number of devices in the output current source is 1 to 10 the output current $I_{out}$ through point 223 will be 10 times the reference current produced by $I_{ref}$ 225. The same type headroom problem can occur whether $I_{ref}$ and $I_{out}$ are equal or multiples. So, for example, if the common mode voltage 223 of the differential input circuit 229, drops low enough (for example, if $I_{nn}$ 219 and $I_{np}$ 221 drop low), the 20 devices in parallel, 227, may begin to come out of saturation and enter triode mode. Once the voltage at 223 drops low enough so that the 20 devices 227 begin to enter triode mode, the voltage at the drains of the 20 devices 217 begins to decrease. Once the voltage at the drains of devices 217 begins to decrease, the drain source voltage across devices 217 follows. When the drain source voltage (Vds) across devices 217 decreases to the point where it is lower than the Vds of devices 215, the current through device 217 will decrease. Accordingly, the current in each device 217 becomes less than the current in each device 215 and the current ratio changes due to the lessening of the output current.

Figure 3:
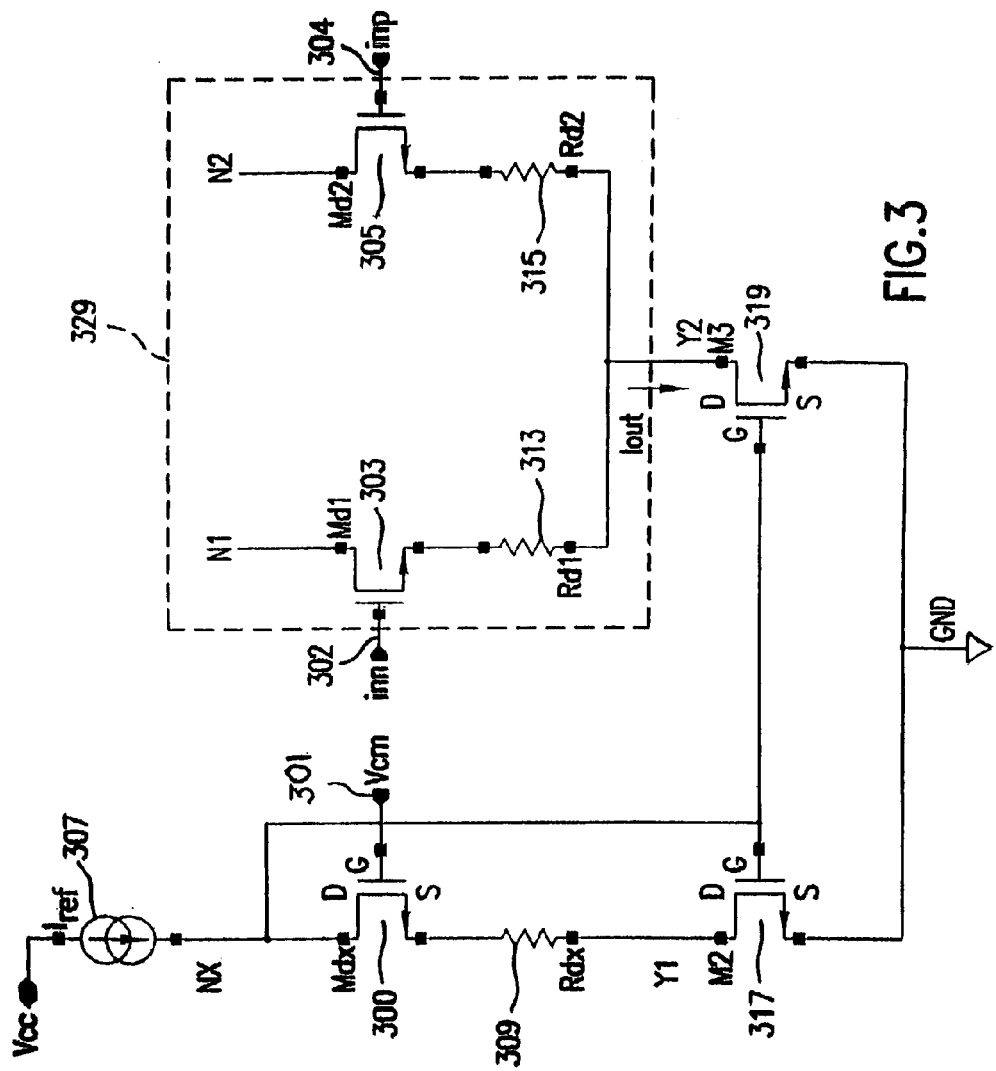
FIG. 3 is a schematic diagram according to an embodiment of the current invention.

FIG. 3 is a schematic diagram according to an embodiment of the current invention. In FIG. 3, the circuit 329, which is coupled to the output current mirror device 319, is again exemplarily a differential input circuit. Those skilled in the art will realize that the differential input circuit 329 serves as an example of a common load circuit but is not limited to a differential circuit. The present embodiment of the invention is applicable to any type of circuit being driven by a current mirror output device 319.

In FIG. 3 a resistor R309 is added between the source of device 300 and the drain of device 317. Resistor 309 is equal to the impedance of circuit 329, as determined by the parallel combination of resistors 313 and 315.

In the circuitry in FIG. 3, device 319 cannot compensate for the low voltage at its drain because the low voltage is a characteristic of the circuit load. Therefore, to be effective, load compensation will need to be accomplished within device 317, in the reference side of the current mirror.

A voltage is placed on the input of device 300 representing the common mode voltage (that is, it represents the average voltage between input 302 and input 304 of the differential input 329) of the circuit 329. As the voltage at the drain of device 319 changes, so will the voltage at the drain of device 317. Because the Vds of device 317 will track the Vds of device 319, and because the gates of device 317 and 319 are tied together, the reference current will track the output current $I_{out}$.

Figure 4:
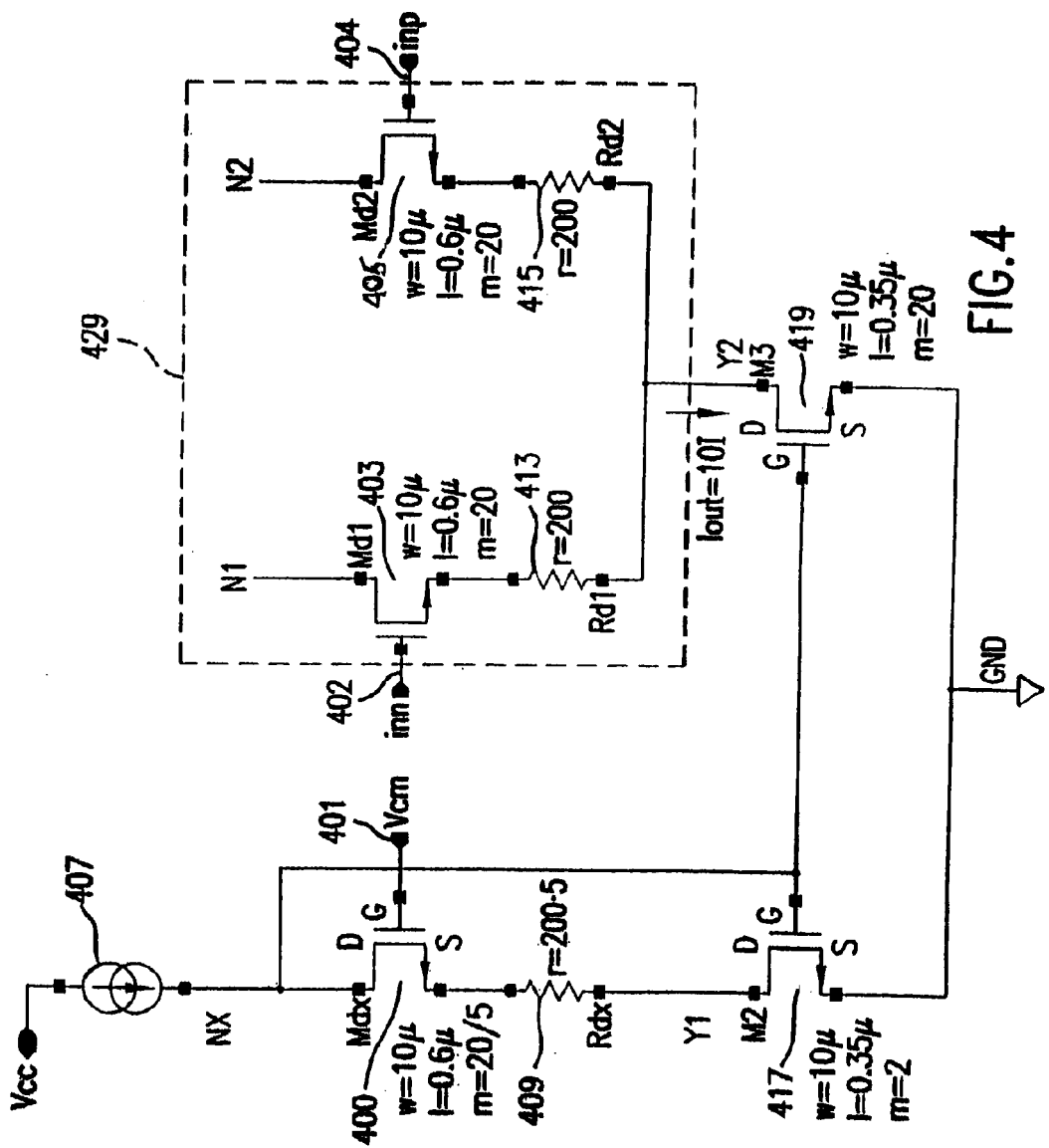
FIG. 4 is a schematic diagram of an embodiment of the invention utilizing a multiplying current mirror.

FIG. 4 is a schematic diagram of an embodiment of the invention utilizing a multiplying current mirror. In FIG. 4, the output current $I_{out}$ is equal to 10 times the current provided by reference generator 407 thereby providing the desired current ratio of 10 to 1. The input 401 represents a common mode voltage, that is, the average between $I_{nn}$ 402 and $I_{np}$ 404. Since the $I_{out}$ of device 419 represents 20 devices in parallel, and reference device 417 represents two devices in parallel, a 10:1 ratio results. 409 represents the parallel combination of the two resistors 413 and 415. Resistor 409 represents 10 times the resistance of circuit 429 or 20 times each individual resistor 413 or 415. The impedance of the reference side is N times the impedance of the output side of the current mirror (where N is the ratio of the output current to the reference current).

Figure 4A:
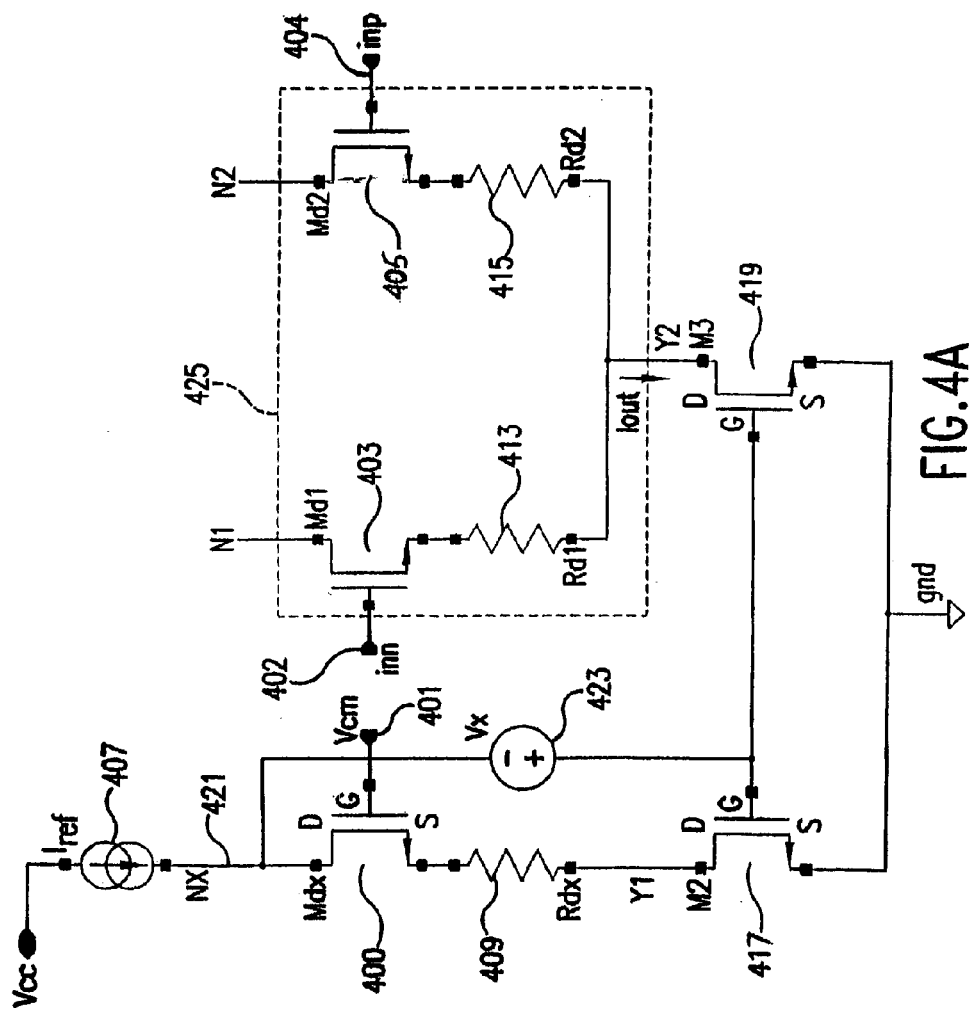
FIG. 4A is a block and schematic diagram of a further embodiment of the invention, in which a voltage supply is added to further improve current mirror matching.

FIG. 4A is a schematic diagram of a further embodiment of the invention, in which a voltage supply is added to further improve current mirror matching. In FIG. 4A a voltage source 423 has been added. In FIG. 4A, just as in FIG. 3, Vds of the reference output device 417 is adjusted to match Vds of the output mirror device 419. The drain voltage of the reference side device 400, however, is different than the drain voltage of device 403. Voltage source 423 equalizes the voltage on the drain of the current mirror 400 with the drain voltage of devices 403 and 405. By matching the drain voltage of the reference side device 400 with the drain voltage of devices 403 and 405, the voltage between the drain of the driver device 400 and the output device 417 is brought to be more in line with the voltage between the output devices 425 and the drain of device 419.

Figure 5:
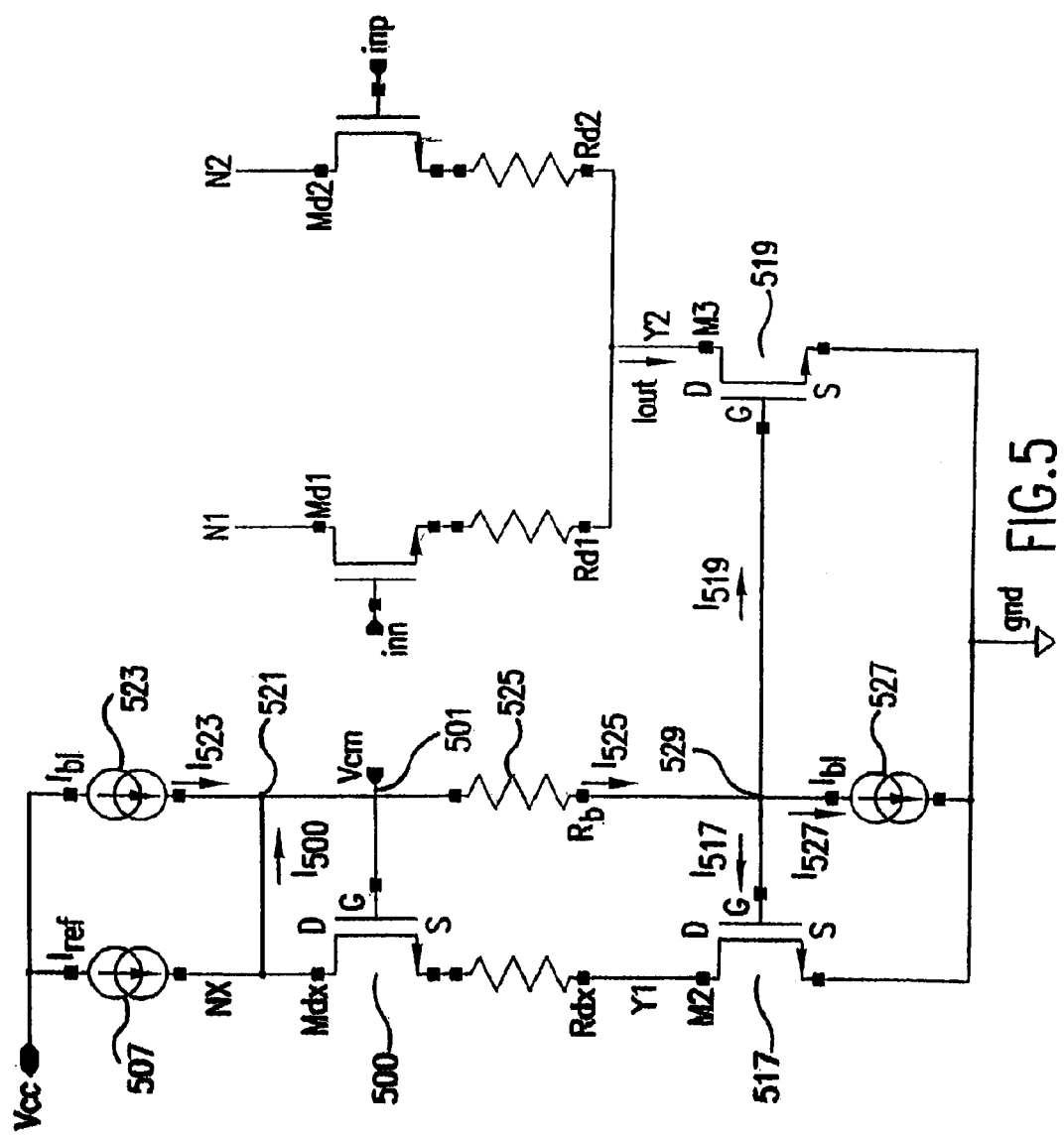
FIG. 5 is a schematic diagram of an implementation of the current mirror illustrated in FIG. 4.

FIG. 5 is a schematic diagram of an exemplary implementation of a current mirror, similar to that illustrated in FIG. 4. In FIG. 5, the combination of a current source 523, resistance 525 and second current source 527, replaces the voltage supply 423 of FIG. 4A. In FIG. 5, the resistor 525 is calculated such that the current $I_{523}$ times the resistance of 525 equals the voltage supply 423 (as illustrated in FIG. 4A). In addition, current supply 527 is set equal to current supply 523. From Kirchoff's current laws the sum of currents into a node must always equal 0. Thus current $I_{525}$ minus current $I_{517}$ minus current $I_{519}$ minus current $I_{527}$ equals 0. Likewise, current $I_{523}$ plus $I_{500}$ minus $I_{525}$ must equal 0. By setting both equations equal to one another it can be determined that $I_{517}$ plus $I_{519}$ must equal $I_{500}$. Because devices 517 and 519 are in fact FET-type devices, $I_{517}$ and $I_{519}$ are negligible. Therefore, current $I_{500}$ is also negligible. Thus, the desired voltage drop across resistor 525 can be achieved by considering only the value of the current sources 523 and 527 and the resistance value of resistor 525.

Figure 6:
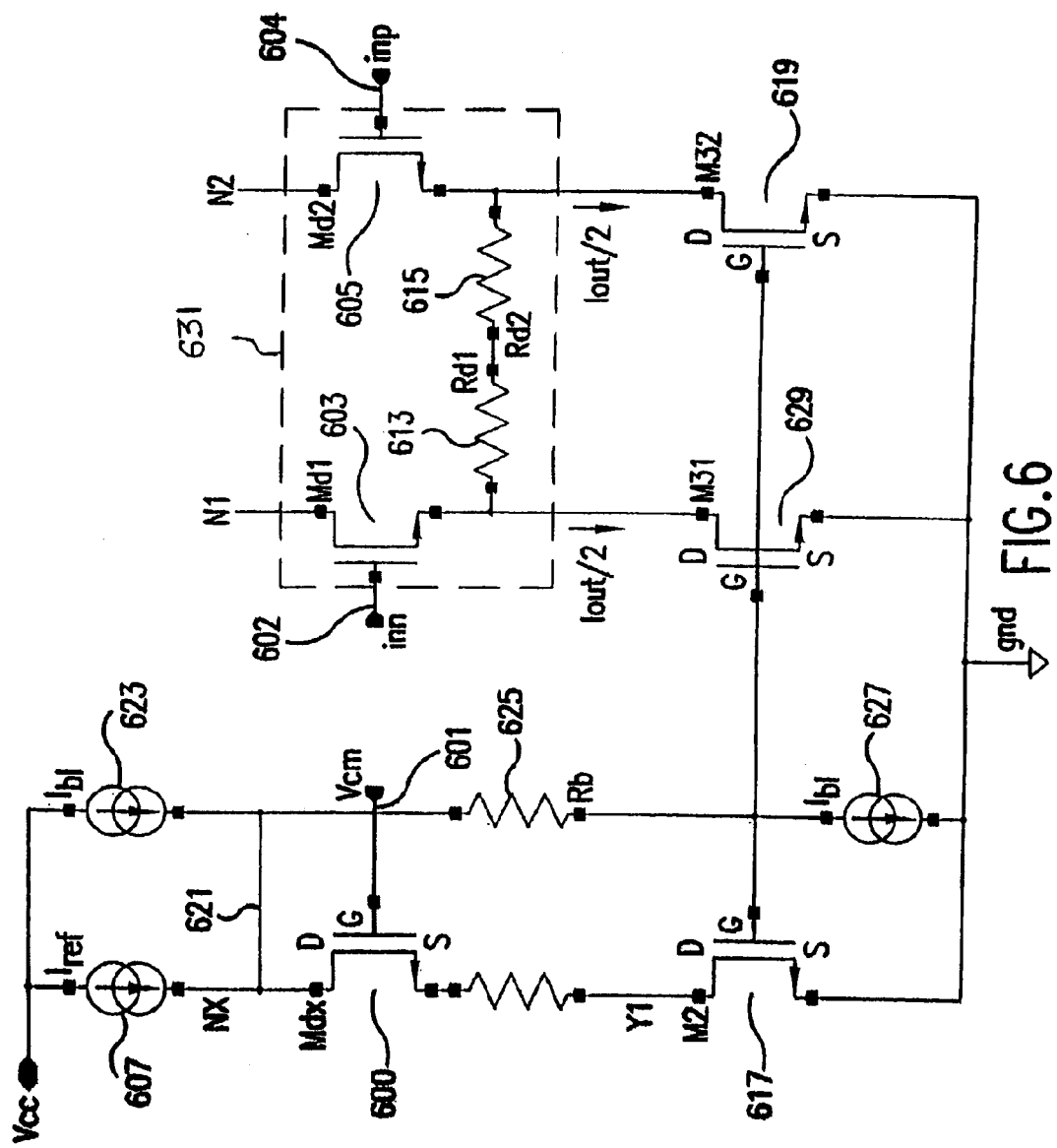
FIG. 6 is a schematic diagram of an embodiment of the invention, illustrating an arrangement of the output devices of a current mirror, which provide current to a differential input circuit.

FIG. 6 is a schematic diagram of an alternate embodiment of the invention, illustrating an arrangement of the output devices of a current mirror providing current to a differential input circuit. In FIG. 6, individual output devices 629 and 619 replace a single output device such as device 519 in FIG. 5. In FIG. 6, the differential input circuit 631 has degenerating resistors 613 and 615 coupled together, not in line with the output current. Such an arrangement can increase the headroom for the output devices of the current mirror. In such an arrangement, however, there could be a larger contribution to thermal noise of differential pair 631 by the current source devices.

Figure 7:
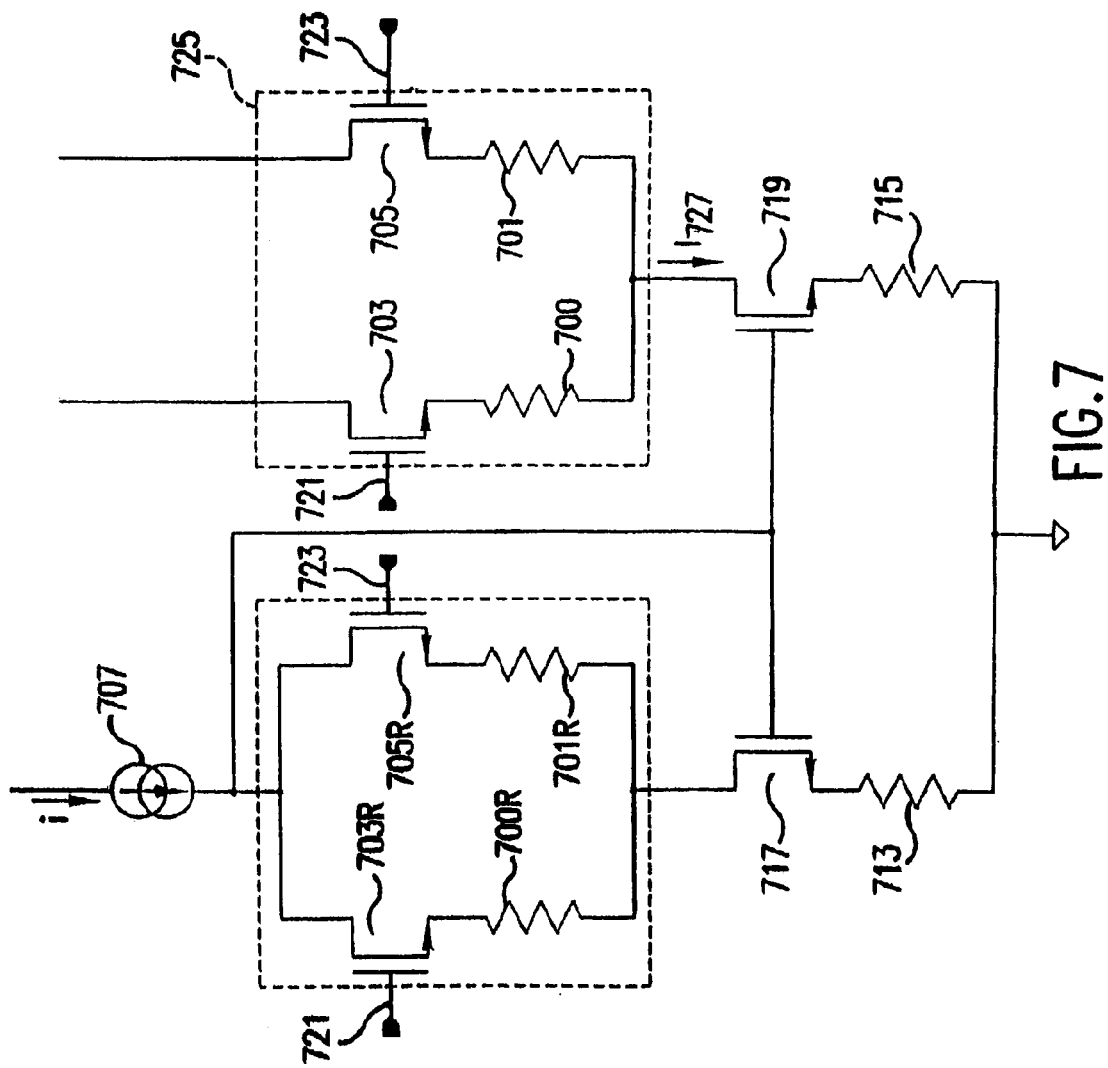
FIG. 7 is a schematic diagram of an embodiment of the invention.

FIG. 7 is a schematic diagram of a further embodiment of the invention. In FIG. 7, the circuit 725 which comprises the load for the output side of the current mirror, is replicated in the reference side of the current mirror. Circuit 725 in the reference side of the current mirror is designated as $725_{ref}$. Input 721, in addition to being coupled to the gate of device 703, is also coupled to the gate of device 703R. Additionally, the signal 723 which is coupled to the gate of the device 705 is also coupled into the gate of device 705R in the circuit $725_{ref}$. In such a manner the circuits 725 and $725_{ref}$ are made electrically equivalent. By making circuit $725_{ref}$ and circuit 725 electrically equivalent, the voltage drop across them will be identical. Additionally, the output devices of the reference side of the current mirror and the output side of the current mirror can be degenerated. That is, resistors 713 and 715 may be added to the circuit. In such a way, the current generated in current source 707 is replicated by $I_{727}$ in the output leg of the current mirror.

What is claimed is:

1. A current mirror circuit, comprising:
   a reference current side capable of generating a reference current, the reference current side including first and second transistors coupled to a third transistor, wherein gates of the first and second transistors receive a differential signal; and
   a load current side capable of generating a load current that is proportional to the reference current, the load current side including fourth and fifth transistors coupled to a sixth transistor, wherein gates of the fourth and fifth transistors receive a differential signal, and wherein a gate of the third transistor is coupled to a gate of the sixth transistor.

2. The current mirror circuit of claim 1, wherein the first and second transistors are coupled to the third transistor through at least one first resistor, and wherein the fourth and fifth transistors are coupled to the sixth transistor through at least one second resistor.

3. The current mirror circuit of claim 2, wherein the at least one first resistor includes a resistor coupled between a source of the first transistor and a drain of the third transistor, and another resistor coupled between a source of the second transistor and the drain of the third transistor.

4. The current mirror circuit of claim 2, wherein the at least one second resistor includes a resistor coupled between a source of the fourth transistor and a drain of the sixth transistor, and another resistor coupled between a source of the fifth transistor and the drain of the sixth transistor.

5. The current mirror circuit of claim 2, further comprising a third resistor coupled between a source of the third transistor and a terminal, and a fourth resistor coupled between a source of the sixth transistor and the terminal.

6. The current mirror circuit of claim 2, wherein a voltage drop across the first and second transistors and the at least one first resistor is approximately equal to a voltage drop across the fourth and fifth transistors and the at least one second resistor.

7. The current mirror circuit of claim 1, wherein the differential signal received by the gates of the first and second transistors and the differential signal received by the gates of the fourth and fifth transistors are same.

8. The current mirror circuit of claim 1, wherein a source of the third transistor is coupled to a source of the sixth transistor.

9. The current mirror circuit of claim 1, wherein drains of the fourth and fifth transistors are coupled to a supply voltage of the load current side.

10. The current mirror circuit of claim 1, wherein drains of the first and second transistors are coupled to the gates of the third and sixth transistors.

11. A method of maintaining a current ratio in a current mirror circuit, the current mirror circuit including a reference current side having first and second transistors coupled to a third transistor, and a load current side having fourth and fifth transistors coupled to a sixth transistor, the sixth transistor having a gate that is coupled to a gate of the third transistor, the method comprising:
   receiving a differential signal at gates of the first and second transistors;
   receiving a differential signal at gates of the fourth and fifth transistors;
   generating a reference current in the reference current side; and
   generating a load current in the load current side that is proportional to the reference current generated in the reference current side.

12. The method of claim 11, wherein receiving the differential signal at the gates of the fourth and fifth transistors includes receiving the differential signal at the gates of the fourth and fifth transistors that the gates of the first and second transistors receive.

13. The method of claim 11, further comprising coupling a source of the third transistor to a source of the sixth transistor.

14. The current mirror circuit of claim 11, further comprising degenerating the third and sixth transistors.

15. The method of claim 11, further comprising receiving a supply voltage of the load current side at drains of the fourth and fifth transistors.

16. The method of claim 11, further comprising maintaining drains of the first and second transistors and a gate of the third transistor at substantially same potential.

17. The method of claim 11, further comprising:
   coupling the first and second transistors to the third transistor through at least one first resistor; and
   coupling the fourth and fifth transistors to the sixth transistor through at least one second resistor.

* * * * *